US008134836B2

(12) United States Patent
Tsai et al.

(10) Patent No.: US 8,134,836 B2

(45) Date of Patent: Mar. 13, 2012

(54) PACKAGED HEAT DISSIPATING ASSEMBLY FOR AN INTERMEDIATE BUS CONVERTER

(75) Inventors: Chung-Yu Tsai, Tamshui Chen (TW); Bo-Hao Lin, Tamshui Chen (TW); Yu-Kun Sun, Tamshui Chen (TW)

(73) Assignee: ACBEL Polytech Inc., Taipei Hsien (TW)

( * ) Notice: Subject to any disclaimer, the term of this patent is extended or adjusted under 35 U.S.C. 154(b) by 321 days.

(21) Appl. No.: 12/511,333

(22) Filed: Jul. 29, 2009

(65) Prior Publication Data

US 2010/0212864 A1 Aug. 26, 2010

(30) Foreign Application Priority Data

Feb. 24, 2009 (TW) .............................. 98105723 A

(51) Int. Cl.
*H05K 7/20* (2006.01)
*F28F 7/00* (2006.01)

(52) U.S. Cl. ........ 361/715; 361/703; 361/704; 361/710; 361/719; 174/16.3; 165/80.3; 257/713; 257/722; 363/141

(58) Field of Classification Search .................... 361/679.46–679.54, 688–723; 165/80.2–80.3, 185; 174/16.3, 547, 252; 257/712–713, 722; 312/236; 363/141
See application file for complete search history.

(56) References Cited

U.S. PATENT DOCUMENTS

| | | | | |
|---|---|---|---|---|
| 6,084,178 | A * | 7/2000 | Cromwell | 174/383 |
| 7,035,105 | B2 * | 4/2006 | Yamaguchi | 361/707 |
| 2004/0252461 | A1 * | 12/2004 | Wu | 361/704 |

* cited by examiner

*Primary Examiner* — Zachary M Pape
(74) *Attorney, Agent, or Firm* — Rabin & Berdo, P.C.

(57) ABSTRACT

A packaged heat dissipating assembly for an intermediate bus converter (IBC) has a frame being mounted on and around the IBC and a heat sink being mounted on the frame. The packaged heat dissipating assembly is easily detached from the IBC. Therefore, a broken bus converter module (BCM) or heat sink is easily replaced separately. Consequently, heat dissipating designs and maintenance of a server or communication equipment is facilitated and maintenance costs of the IBC and the server or communication equipment are lowered.

14 Claims, 5 Drawing Sheets

PACKAGED HEAT DISSIPATING ASSEMBLY FOR AN INTERMEDIATE BUS CONVERTER

BACKGROUND OF THE INVENTION

1. Field of the Invention

The present invention relates to a packaged heat dissipating assembly for an intermediate bus converter (IBC), especially to a packaged heat dissipating assembly that is detachably mounted on an IBC to dissipate heat from and maintain the IBC at a constant temperature.

2. Description of the Prior Arts

A power supply system for a large-scale server or communication equipment comprises a power supply and an intermediate bus architecture (IBA). The power supply rectifies alternating current (AC) to direct current (DC). The IBA has multiple intermediate bus converters (IBCs). Each IBC is a miniaturized and high-powered power supply module that transforms the DC to lower voltage and higher current to provide sufficient power to electronic components of the server or communication equipment.

With reference to FIG. 5, the IBC (50) comprises a circuit board (51) and at least one bus converter module (BCM) (52) being mounted on the circuit board (51). Since the at least one BCM (52) generate heat while operating, a heat dissipating assembly is mounted on the IBC (50) to prevent overheating of the IBC (50), server or communication equipment.

A conventional heat dissipating assembly (60) for the IBC (50) comprises a frame (61) and a heat sink (62). The frame (61) is mounted around a peripheral edge of the circuit board (51) and around the BCM (52) of the IBC (50). The heat sink (62) is mounted on the frame (61) to dissipate heat from the IBC (50) and has a base (621) and multiple fins (622) being formed perpendicularly and parallelly on, and protruding from the base (61).

Then, glue (70) is filled between the circuit board (51) and the BCM (52) of the IBC (50) and the base (621) of the heat sink (62) of the packaged heat dissipating assembly (60) to securely adhere the packaged heat dissipating assembly (60) to the IBC (50).

However, since large-scale servers or communication equipment have multiple electronic components being mounted inside and demand large power, many IBCs (50) are needed to provide sufficient power. Furthermore, as space inside the server or the communication equipment is limited, the IBCs (50) are closely arranged in the server or the communication equipment causing accumulating of heat generated by the IBCs (50). In addition, scales and sizes of the servers or the communication equipment are designed according to different requirements of different enterprises. Thus, according to different environment where the server or the communication equipment are located, different heat dissipating designs are needed.

Further, size of each fin (622) and distance between each two adjacent fins (622) of the heat sink (62) influence heat dissipating effect of the packaged heat dissipating assembly (60). When upgrading the server or electronic equipment, the heat dissipating effect of the IBC (50) may become insufficient, so the IBC (50) with the conventional packaged heat dissipating assembly (60) must be removed from the server or the communication equipment and replaced with another IBC (50) having more efficient heat dissipating effect. Since the IBC (50) is expensive, replacing the IBC (50) causes waste. Moreover, the server or the communication equipment has to be stopped while replacing the IBC (50), which may also prevent an enterprise dependent on the server from operating.

To overcome the shortcomings, the present invention provides a packaged heat dissipating assembly for an IBC to mitigate or obviate the aforementioned problems.

SUMMARY OF THE INVENTION

The main objective of the present invention is to provide a packaged heat dissipating assembly for an intermediate bus converter (IBC). The packaged heat dissipating assembly has a frame being mounted on and around the IBC and a heat sink being mounted on the frame.

The packaged heat dissipating assembly is easily detached from the IBC. Therefore, a broken bus converter module (BCM) or heat sink is easily replaced separately. Consequently, heat dissipating designs and maintenance of servers or communication equipment is facilitated and maintenance costs of the IBC and the server or communication equipment are lowered.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
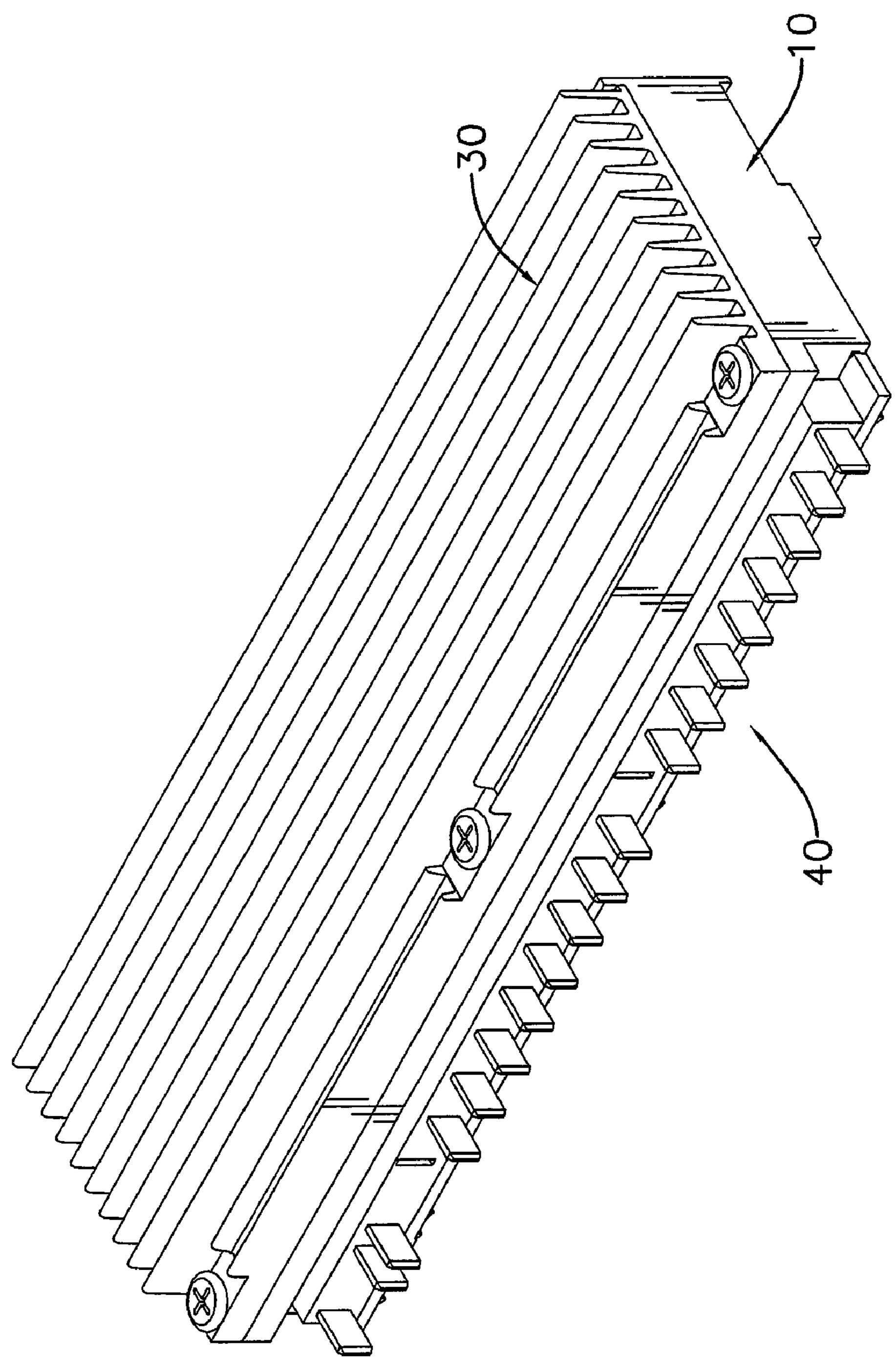
FIG. 1 is a perspective view of a packaged heat dissipating assembly for an intermediate bus converter (IBC) in accordance with the present invention.
Figure 2:
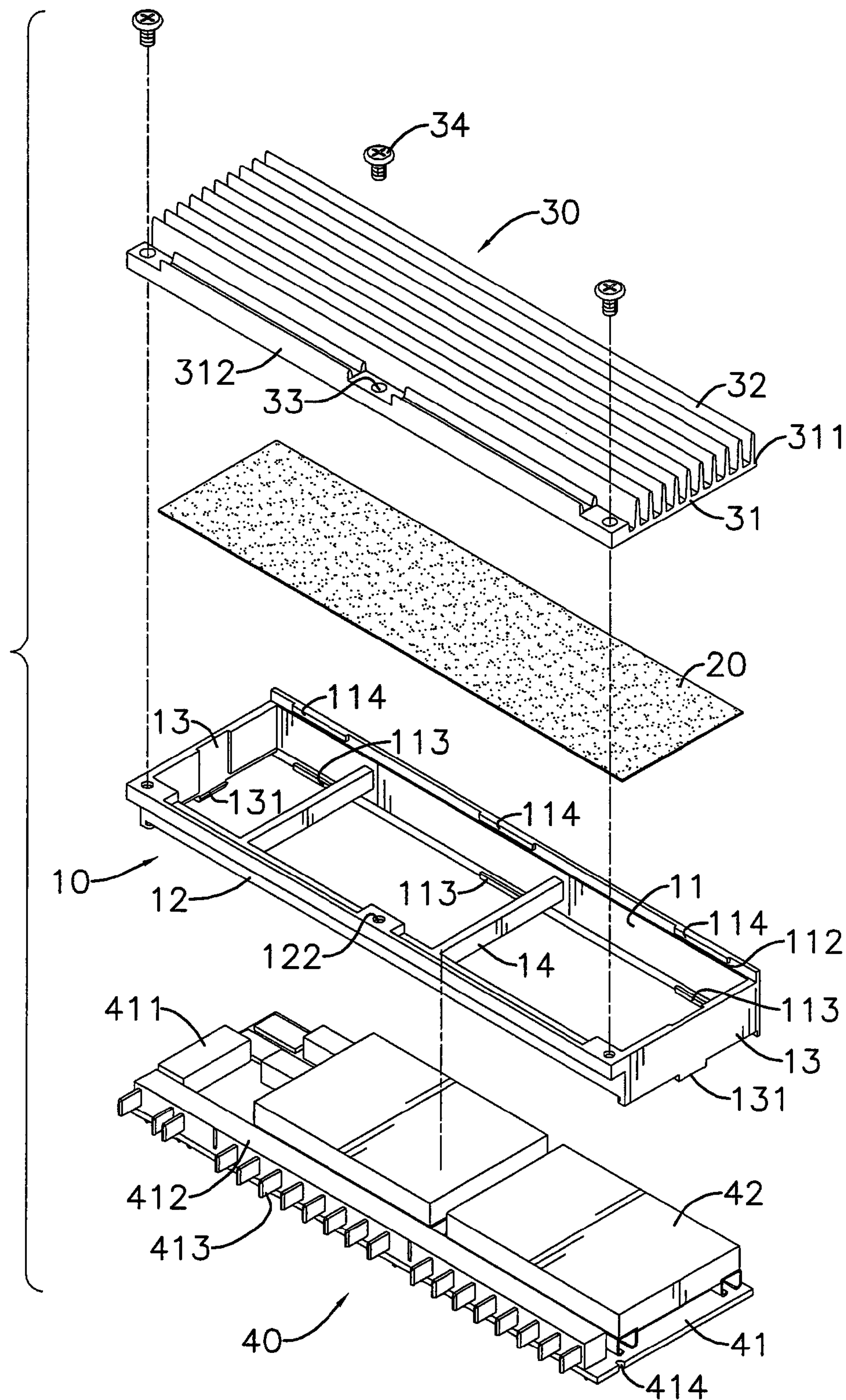
FIG. 2 is an exploded perspective view of the packaged heat dissipating assembly in FIG. 1.

With reference to FIGS. 1 and 2, an intermediate bus converter (IBC) (40) comprises a circuit board (41) and at least one bus converter module (BCM) (42). The circuit board (41) has a mounting surface, two opposite side edges, two opposite end edges, multiple circuits, multiple electronic components (411), a connector (412), multiple pins (413) and at least one detent (414). The circuits are arranged on the circuit board (41). The electronic components (411) are mounted on the mounting surface of the circuit board (41) and are connected to the circuits of the circuit board (41). The connector (412) is mounted on the mounting surface of the circuit board (41) adjacent to one side edge of the circuit board (41). The pins (413) protrude out from the connector (412) and are connected to the circuits of the circuit board (41). The at least one detent (414) is formed in a corresponding end edge of the circuit board (41). The at least one BCM (42) is mounted on the mounting surface of the circuit board (41) and is connected to the circuits of the circuit board (41).

A packaged heat dissipating assembly for the IBC (40) in accordance with the present invention comprises a frame (10), an optional thermal pad (20), a heat sink (30) and at least one optional fastener (34).

The frame (10) is mounted on the mounting surface of the circuit board (41) around the BCM (42) and has an optional first side panel (11), an optional second side panel (12), at least one fastening part (122), two optional opposite end panels (13) and at least one optional reinforcement bar (14).

Figure 3:
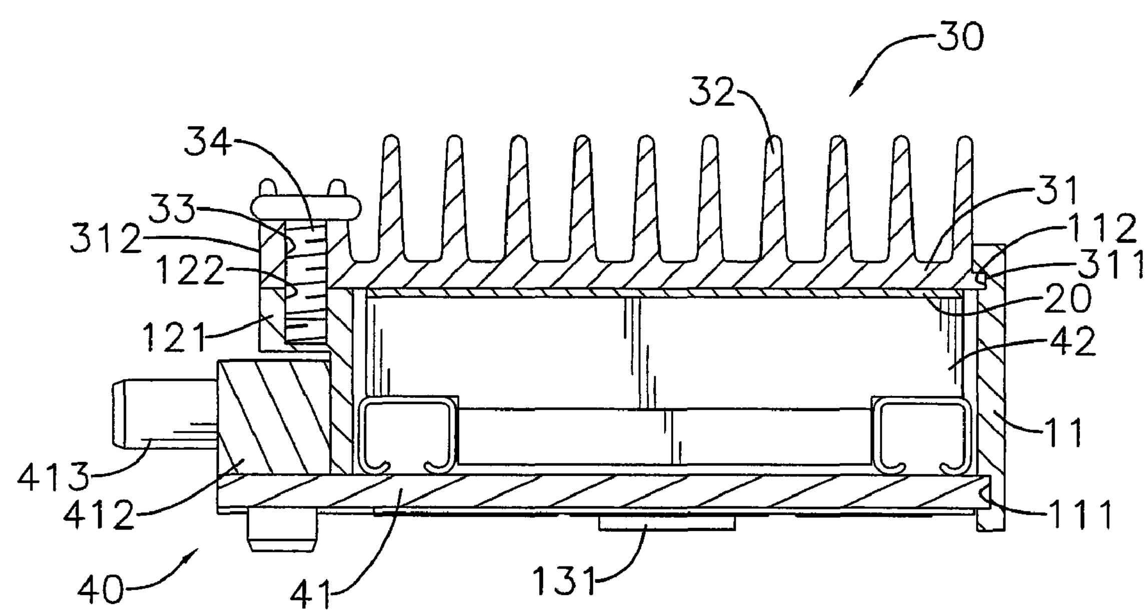
FIG. 3 is a side view in partial section of the packaged heat dissipating assembly in FIG. 1.

With further reference to FIG. 3, the first side panel (11) is mounted along a corresponding side edge of the circuit board (41) opposite to the connector (412) of the circuit board (41), has an inner surface, a rear edge, a front edge, an optional rear positioning recess (111), an optional front positioning recess (112), at least one optional rear protrusion (113) and at least one front protrusion (114). The rear positioning recess (111) is formed in the inner surface of the first side panel (11), adjacent to and along the rear edge of the first side panel (11). The front positioning recess (112) is formed in the inner surface of the first side panel (11) adjacent to and along the front edge of the first side panel (11). The at least one rear protrusion (113) is formed on and protrudes from the inner surface of the first side panel (11) adjacent to the rear edge of the first side panel (11) and may be formed between the rear positioning recess (111) and the rear edge of the first side panel (11). The at least one front protrusion (114) is formed on and protrudes from the inner surface of the first side panel (11) adjacent to the front edge of the first side panel (11) and may be formed between the front positioning recess (112) and the front edge of the first side panel (11).

The second side panel (12) is opposite to the first side panel (11) and is mounted on the connector (412) of the circuit board (41).

The at least one fastening part (122) of the frame (10) is formed in the frame (10) and may be formed in the second side panel (12). Each of the at least one fastening part (122) of the frame (10) may be implemented with a fastening hole.

Figure 4:
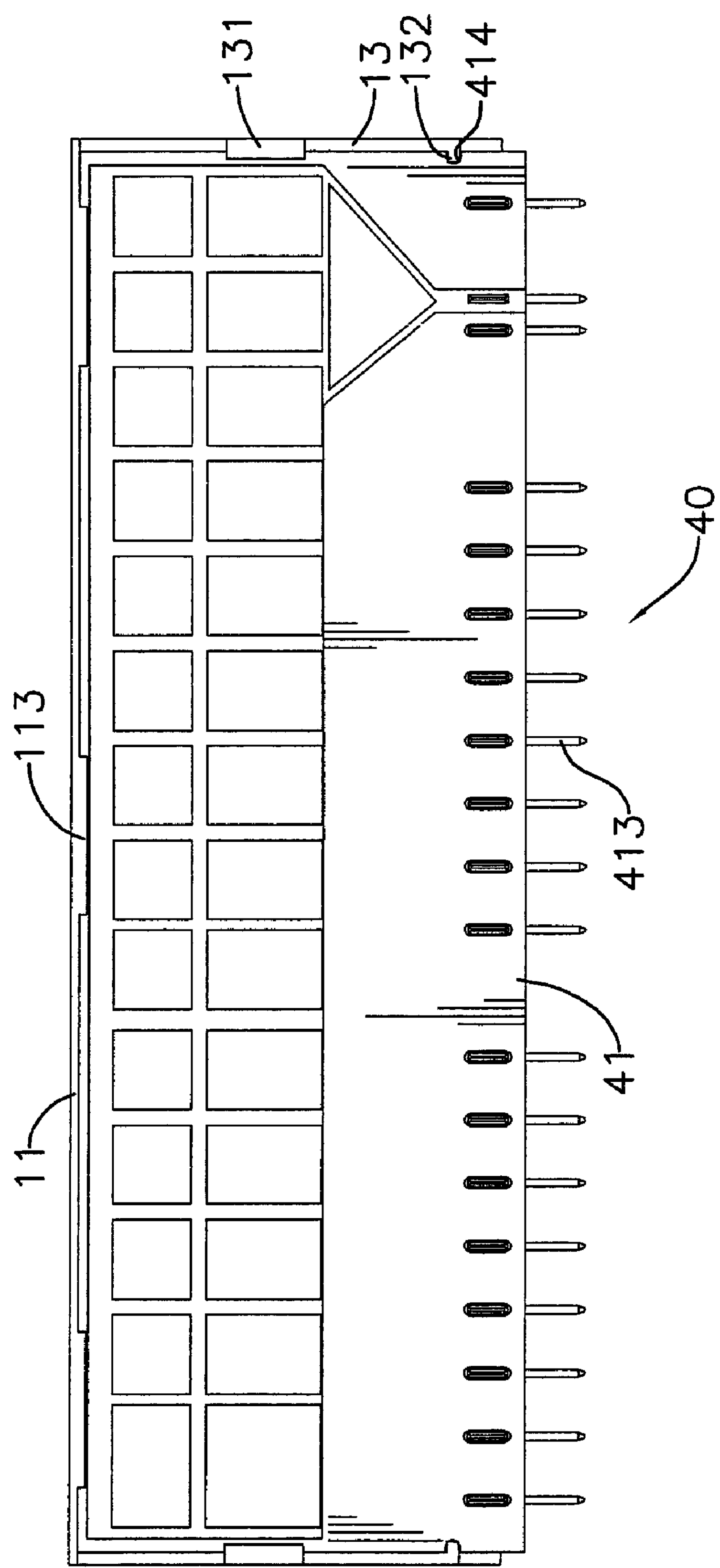
FIG. 4 is another side view of the packaged heat dissipating assembly in FIG. 1.
Figure 5:
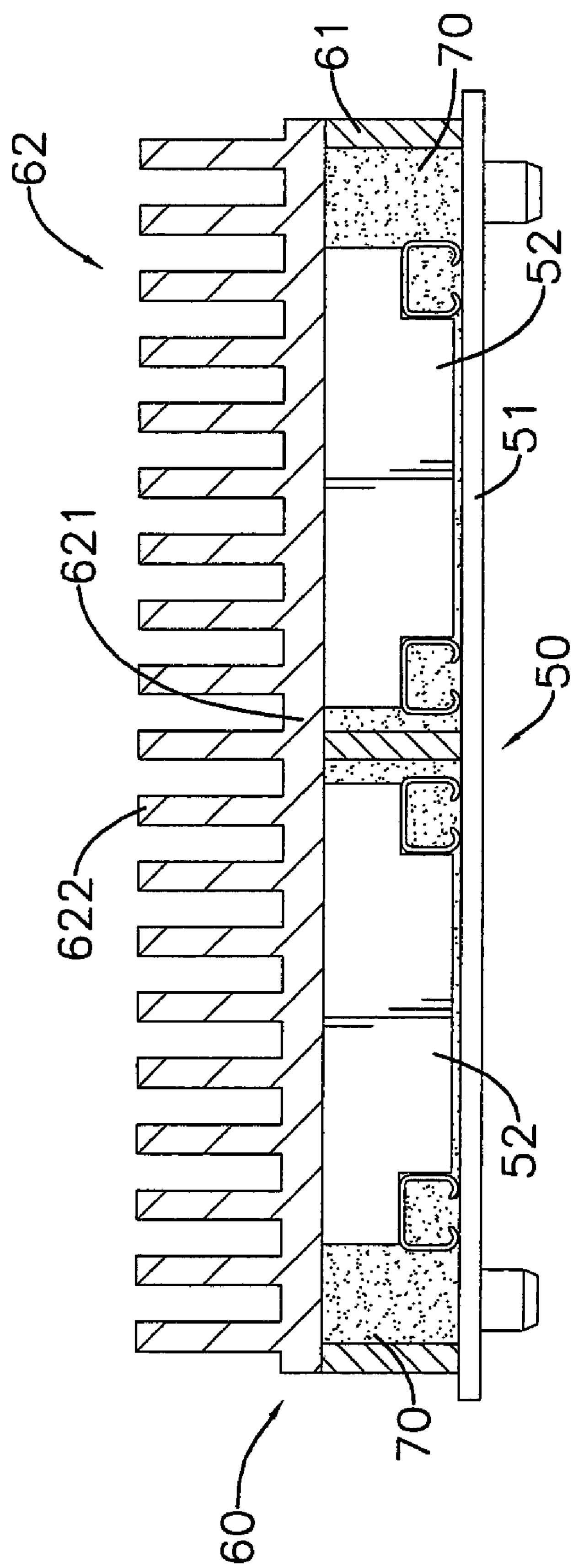
FIG. 5 is a side view in partial section of an IBC with a conventional packaged heat dissipating assembly in accordance with the prior art.

With further reference to FIG. 4, the end panels (13) are connected between the first and second side panels (11, 12) and are mounted respectively along the end edges of the circuit board (41). Each end panel (13) has a rear edge, a front edge and an inner surface and may have at least one holding protrusion (131) and at least one positioning protrusion (132). The at least one holding protrusion (131) is formed on the rear edge of the end panel (13), protrudes toward the inner surface of the end panel (13) and holds the circuit board (41) securely to the frame (10). The at least one positioning protrusion (132) is formed on the rear edge of the end panel (13), protrudes toward the inner surface of the end panel (13) and engages a corresponding detent (414) of the circuit board (41) to prevent the IBC (40) from sliding out of the frame (10).

The at least one reinforcement bar (14) is formed between the first side panel (11) and the second side panel (12) to reinforce the structural strength of the frame (10) and is mounted adjacent to the BCM (42).

The thermal pad (20) is attached to the frame (10) and on the BCM (42) to conduct heat from the BCM (42).

The heat sink (30) is detachably mounted on the frame (10), may be mounted on the thermal pad (20) and has a base (31), multiple fins (32) and at least one fastening part (33).

The base (31) is mounted detachably on the frame (10), may be mounted on the front edges of the end panels (13) and the second side panel (12) and may have a first edge (311) and a second edge (312). The first edge (311) of the base (31) is held between the front edges of the end panels (13) and the front protrusions (114) of the first side panel (11) and may be mounted in the front positioning recess (112) of the first side panel (11). The second edge (312) of the base (31) is mounted on the second side panel (12).

The fins (32) are formed parallelly on and protrude perpendicularly from the base (31).

The at least one fastening part (33) of the heat sink (30) is formed on the base (31) and may be adjacent to the second edge of the base (10). Each of the at least one fastening part (33) of the heat sink (30) corresponds to and is fastened to a corresponding fastening part (122) of the frame (10) and may be implemented with a through hole. Each of the at least one through hole of the heat sink (30) aligns with each of the at least one fastening hole of the frame (10).

Each of the at least one fastener (34) is mounted through the corresponding through hole of the heat sink (30) and is fastened to the corresponding fastening hole of the frame (10) to secure the heat sink (30) to the frame (10).

The packaged heat dissipating assembly for the IBC (40) as described has the following advantages. The packaged heat dissipating assembly is easily detached from the IBC (40). Therefore, a broken BCM (42) is easily replaced. Furthermore, the heat sink (30) is replaced according to arrangement of electronic components of a server or communication equipment. Consequently, heat dissipating designs and maintenance of the server or communication equipment are facilitated and maintenance costs of the IBC (40) and server or communication equipment are lowered.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A packaged heat dissipating assembly, comprising:
- a frame having
  - a first side panel having an inner surface, a rear edge, a front edge and at least one rear protrusion formed on and protruding from the inner surface of the first side panel adjacent to the rear edge of the first side panel;
  - a second side panel opposite to the first side panel;
  - at least one fastening part; and
  - two opposite end panels connected between the first and second side panels, each end panel having a rear edge, a front edge, an inner surface and at least one holding protrusion formed on the rear edge of the end panel and protruding toward the inner surface of the end panel; and
- a heat sink detachably mounted on the frame and having
  - a base mounted detachably on the frame;
  - multiple fins formed parallelly on and protruding perpendicularly from the base; and
  - at least one fastening part formed on the base, the at least one fastening part of the heat sink corresponding to and being fastened to the fastening part of the frame.

2. The packaged heat dissipating assembly as claimed in claim 1, wherein
- the frame further has
  - at least one front protrusion formed on and protruding from the inner surface of the first side panel adjacent to the front edge of the first side panel;
- the at least one fastening part of the frame is formed in the second side panel;
- the heat sink is mounted on the front edges of the end panels and the second side panel and has
  - a first edge held between the front edges of the end panels and the front protrusions of the first side panel; and
  - a second edge mounted on the second side panel; and
- the at least one fastening part of the heat sink is adjacent to the second edge of the base.

3. The packaged heat dissipating assembly as claimed in claim 2, wherein the frame further has at least one reinforcement bar formed between the first side panel and the second side panel of the frame.

4. The packaged heat dissipating assembly as claimed in claim 3, further comprising a thermal pad mounted between the frame and the heat sink.

5. The packaged heat dissipating assembly as claimed in claim 4, wherein the first side panel of the frame further has a front positioning recess formed in the inner surface of the first side panel adjacent to and along the front edge of the first side panel;

the front protrusion of the first side panel of the frame is formed between the front positioning recess and the front edge of the first side panel; and the first edge of the base of the heat sink is mounted in the front positioning recess of the first side panel.

6. The packaged heat dissipating assembly as claimed in claim 2, further comprising a thermal pad mounted between the frame and the heat sink.

7. The packaged heat dissipating assembly as claimed in claim 6, wherein the first side panel of the frame further has a front positioning recess formed in the inner surface of the first side panel adjacent to and along the front edge of the first side panel;

the front protrusion of the first side panel of the frame is formed between the front positioning recess and the front edge of the first side panel; and the first edge of the base of the heat sink is mounted in the front positioning recess of the first side panel.

8. The packaged heat dissipating assembly as claimed in claim 2, wherein each of the at least one fastening part of the frame is a fastening hole;

each of the at least one fastening part of the heat sink is a through hole aligning with a corresponding fastening hole of the frame; and the packaged heat dissipating assembly further has at least one fastener mounted through a corresponding through hole of the heat sink and fastened to a corresponding fastening hole of the frame.

9. The packaged heat dissipating assembly as claimed in claim 8, wherein each end panel further has at least one positioning protrusion formed on the rear edge of the end panel and protruding toward the inner surface of the end panel.

10. The packaged heat dissipating assembly as claimed in claim 9, wherein the first side panel of the frame further has a rear positioning recess formed in the inner surface of the first side panel and adjacent to and along the rear edge of the first side panel; and the at least one rear protrusion of the first side panel of the frame is formed between the rear positioning recess and the rear edge of the first side panel.

11. The packaged heat dissipating assembly as claimed in claim 8, wherein the first side panel of the frame further has a rear positioning recess formed in the inner surface of the first side panel and adjacent to and along the rear edge of the first side panel; and the at least one rear protrusion of the first side panel of the frame is formed between the rear positioning recess and the rear edge of the first side panel.

12. The packaged heat dissipating assembly as claimed in claim 1, wherein the frame further has at least one reinforcement bar formed between the first side panel and the second side panel of the frame.

13. The packaged heat dissipating assembly as claimed in claim 12, further comprising a thermal pad mounted between the frame and the heat sink.

14. The packaged heat dissipating assembly as claimed in claim 1, further comprising a thermal pad mounted between the frame and the heat sink.

* * * * *